(12) United States Patent
Jung et al.

(10) Patent No.: US 7,529,116 B2
(45) Date of Patent: May 5, 2009

(54) MEMORY DEVICE HAVING A THRESHOLD VOLTAGE SWITCHING DEVICE AND A METHOD FOR STORING INFORMATION IN THE MEMORY DEVICE

(75) Inventors: Yong Soo Jung, Seoul (KR); Min Yong Lee, Seoul (KR)

(73) Assignee: Hynix Semiconductor Inc., Gyeonngi-do (KR)

( * ) Notice: Subject to any disclaimer, the term of this patent is extended or adjusted under 35 U.S.C. 154(b) by 180 days.

(21) Appl. No.: 11/771,131

(22) Filed: Jun. 29, 2007

(65) Prior Publication Data
US 2008/0158937 A1 Jul. 3, 2008

(30) Foreign Application Priority Data
Dec. 28, 2006 (KR) ...................... 10-2006-0137190

(51) Int. Cl.
*G11C 11/24* (2006.01)
(52) U.S. Cl. ....................... 365/149; 365/100
(58) Field of Classification Search ................. 365/149, 365/100, 148
See application file for complete search history.

(56) References Cited

U.S. PATENT DOCUMENTS

| | | | |
|---|---|---|---|
| 6,597,231 B2 | 7/2003 | Tsutsumi | |
| 7,082,020 B2 | 7/2006 | Friedrichs et al. | |
| 7,173,844 B2 * | 2/2007 | Lee et al. | ..................... 365/145 |
| 7,177,203 B2 * | 2/2007 | Moriyama | ............. 365/189.09 |
| 7,251,154 B2 * | 7/2007 | Hush | .......................... 365/148 |
| 7,295,462 B2 * | 11/2007 | Farnworth | .................. 365/158 |
| 2004/0257872 A1 | 12/2004 | Chen et al. | |

FOREIGN PATENT DOCUMENTS

| KR | 10-2003-0093035 | 12/2003 |
|---|---|---|
| KR | 10-2006-0084667 | 7/2006 |

\* cited by examiner

*Primary Examiner*—Anh Phung
(74) *Attorney, Agent, or Firm*—Marshall, Gerstein & Borun LLP

(57) ABSTRACT

Disclosed herein is a memory device having an increased level of integration with a simplified method of manufacture. The memory device includes: a plurality of word lines and a plurality of bit lines each regularly arranged, and a plurality of unit memory cells each formed at an intersection between an associated one of the word lines and an associated one of the bit lines, wherein each unit memory cell includes a capacitor connected to one of the bit lines and a threshold voltage switching device comprising two terminals, one terminal being connected to the capacitor and the other terminal being connected to one of the bit lines, the threshold voltage switching device being capable of switching current flow at a specific threshold voltage via a rapid variation in resistance depending upon a voltage applied through the word line and the bit line, wherein the capacitor is capable of accumulating electric charges supplied from the bit line based on a switching operation of the threshold voltage switching device.

7 Claims, 2 Drawing Sheets

MEMORY DEVICE HAVING A THRESHOLD VOLTAGE SWITCHING DEVICE AND A METHOD FOR STORING INFORMATION IN THE MEMORY DEVICE

CROSS-REFERENCE TO RELATED APPLICATION

Priority to Korean patent application number 10-2006-0137190, filed on Dec. 28, 2006, the disclosure of which is incorporated by reference in its entirety, is claimed.

BACKGROUND OF THE INVENTION

1. Field of the Invention

The invention relates to a memory device and a method for storing information in the memory device. More specifically, the invention relates to a memory device using a threshold voltage switching device as a switching element and a method for storing information in the memory device.

2. Related Technology

Magnetic, optical, and electric recordings are widely used for recording, storing, and reproducing information. In particular, electric recording has no limitation on the size of media for information storage via current flow, thus enabling a significant increase in storage density. Media for electric recording include dynamic random access memories (DRAMs), flash memory devices for storing information via an injection of charges on a silicon oxide nitride ($SiN_xO_y$) layer, and ferroelectric random access memories (FRAMs) utilizing dielectric polarization of ferroelectrics. Semiconductor memories have advantages of compact size, high reliability, and low fabrication costs. In addition, since semiconductor memories have an advantage of high speed operation, they are widely utilized in applications including main memories in computers, embedded memories, and cache memories in microprocessors.

DRAM, which is most generally used in semiconductor memories, includes a plurality of unit cells each having a word line operated by a row address, a bit line operated by a column address, a cell transistor whose drain and gate are connected to the bit line and the word line, respectively, and a capacitor for charge storage connected to a source of the cell transistor.

Hereinafter, a mechanism associated with a writing operation for storing information in the DRAM cell and a reading operation for reading the information will be described.

When a word line is activated, a cell transistor connected to the word line turns on. While the voltage of the bit line is applied to a unit cell through a drain of the cell transistor, an electric charge is stored in the storage electrode of the capacitor. At this time, the voltage supplied into the bit line is 0V or Vdd (i.e., an operation voltage). A fixed power voltage (Vcc), which is generally about half of the operation voltage (Vdd), is supplied to a plate electrode of the capacitor.

With trends toward more highly integrated semiconductor memory devices, there has been a reduction in memory device size. In an attempt to form a DRAM capacitor having a maximum capacitance within a limited area, the formation of a trench-type storage electrode or the application of a dielectric film having a high dielectric constant have been suggested. For transistors, there have been active efforts (e.g., the formation of a recessed channel) to ensure a sufficient channel length within a small area. Despite these attempts, there is no memory device that completely satisfies the requirements of large capacity, high integration, and high speed. Accordingly, there still remains a demand for memory devices that can be substituted for transistors, occupy a small area, and are readily manufactured via a simplified procedure.

BRIEF SUMMARY OF THE INVENTION

The invention provides a memory device having a threshold voltage switching element improving integration via simplified fabrication in a small area, and a method for storing information in the memory device.

In accordance with one aspect of the invention, there is provided a memory device including: a plurality of word lines and a plurality of bit lines each regularly arranged; and a plurality of unit memory cells each formed at an intersection between an associated one of the word lines and an associated one of the bit lines, wherein each unit memory cell includes: a capacitor connected to one of the bit lines and a threshold voltage switching device including two terminals, one terminal being connected to the capacitor and the other terminal being connected to one of the bit lines, the threshold voltage switching device being capable of switching current flow at a specific threshold voltage via a rapid variation in resistance depending upon a voltage applied through the word line and the bit line, wherein the capacitor is capable of accumulating electric charges supplied from the bit line based on a switching operation of the threshold voltage switching device.

The threshold voltage switching device preferably includes: a substrate; a material layer formed on the substrate, the material layer being capable of undergoing a rapid variation in resistance depending upon the voltage applied; and an electrode in contact with the material layer.

The electrode preferably includes: a first electrode in contact with the material layer at one terminal of the threshold voltage switching device, the first electrode electrically connecting the material layer to the capacitor; a second electrode in contact with the material layer at other terminal of the threshold voltage switching device, the second electrode electrically connecting the material layer to one of the bit lines; and a third electrode arranged on the material layer, the third electrode being capable of applying a bias voltage to the material layer.

In accordance with another aspect of the invention, there is provided a method for storing information in a memory device having a threshold voltage switching device, the threshold voltage switching device being positioned at a memory cell defined at an intersection between a word line and an associated bit line among a plurality of other word lines and a plurality of other bit lines each uniformly arranged, and being arranged at an intersection between the word line and the bit line, the threshold voltage switching device being capable of switching current flow at a specific threshold voltage comprising: applying a voltage to the word line and the associated bit line such that the difference in electric potential between the word line and the associated bit line each connected to the memory cell is higher than the specific threshold voltage.

DETAILED DESCRIPTION OF THE INVENTION

The invention provides a memory device using a device with a threshold-voltage switching property (hereinafter, referred to as a "threshold voltage switching device"), instead of a transistor to transmit information.

When a predetermined voltage (i.e., threshold voltage $V_{th}$) is applied, resistance is significantly reduced to and continuously maintained at a specific value. On the other hand, when the applied voltage is lower than the threshold voltage ($V_{th}$), the resistance returns to an initially high level. This phenomenon is referred to as "threshold voltage switching." The representative materials capable of performing threshold voltage switching are metal oxides. Metal oxide thin films may have a variable resistance significantly depending upon the level of the voltage applied. The exemplary metal oxides include titanium oxide ($TiO_X$), zirconium oxide ($ZrO_X$), nickel oxide ($NiO_x$), niobium oxide ($Nb_2O_3$), and vanadium oxide ($V_2O_3$).

Figure 1:
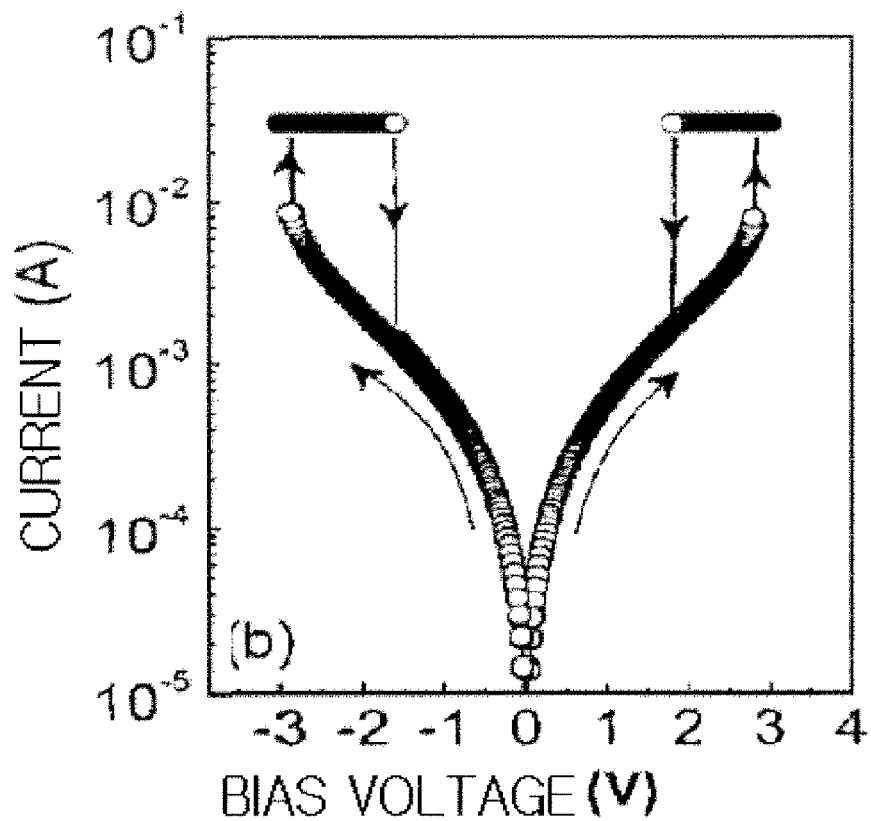
FIG. 1 is a graph illustrating the characteristics of threshold-voltage switching.

FIG. 1 is a graph illustrating the threshold-voltage switching property.

When a bias voltage gradually increasing from 0V is applied to the metal oxide thin film and an opposite polar voltage is applied thereto, the resulting current flowing through the metal oxide film is measured. As a result, as shown in FIG. 1, when a bias voltage of 3V is applied to the metal oxide thin film, current flow increases to a value in the range of about $1 \times 10^{-2}$ A to about $1 \times 10^{-1}$ A. Subsequently, when the applied voltage is gradually decreased, the increased current level (i.e., the decreased state of resistance is maintained). Then, when the applied voltage reaches about 2V, the current significantly decreases. It can be seen from the foregoing that the metal oxide thin film exhibits a memory effect in which variations in resistance are continuously maintained at a predetermined voltage. The applied voltage (e.g., 3V) at which the current significantly increases, is called a "threshold voltage." The metal oxide thin film, to which a voltage higher than the threshold voltage is applied, undergoes a change from a relatively high resistance to a relatively low resistance.

As is apparent from the foregoing, two different resistance values corresponding to the bias voltage applied to the metal oxide thin film can be obtained, and variations in resistance are continuously maintained at the predetermined voltage. Such a phenomenon of the metal oxide thin film can be employed in the fabrication of a memory device.

Figure 2:
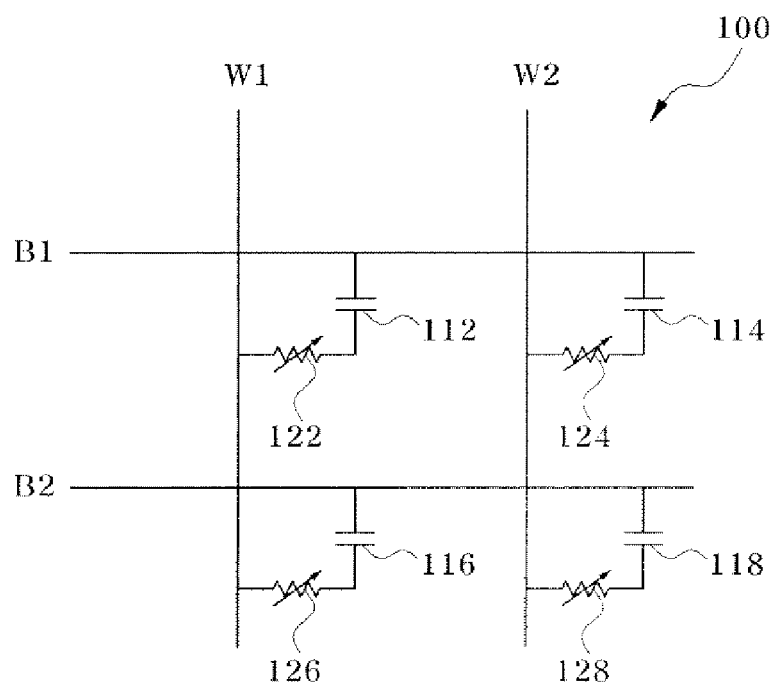
FIG. 2 is a circuit view of a DRAM cell configuration illustrating the structure of a memory device using a threshold voltage switching element according to one embodiment of the invention.

FIG. 2 is a circuit view of a DRAM cell configuration illustrating the structure of a memory device using a threshold voltage switching resistor. For convenience, two word lines and two bit lines are illustrated in FIG. 2.

Referring to FIG. 2, a plurality of word lines W1 and W2 are perpendicularly arranged to a plurality of bit lines B1 and B2. A plurality of capacitors 112, 114, 116, and 118 and a plurality of switching elements 122, 124, 126, and 128 are each formed at an intersection between an associated one of the word lines and an associated one of the bit lines. One terminal of each threshold voltage switching device is connected to an associated one of the word lines W1 and W2. The other terminal of the threshold voltage switching device is connected to an associated one of the capacitors 112, 114, 116, and 118. The resistance of the threshold voltage switching device is significantly varied depending upon the voltage applied to the word lines W1 and W2 and bit lines B1 and B2.

As a result, current flow is rapidly varied, thus being detected as an on/off state. Accordingly, the threshold voltage switching device can be employed as a switching device.

Figure 3:
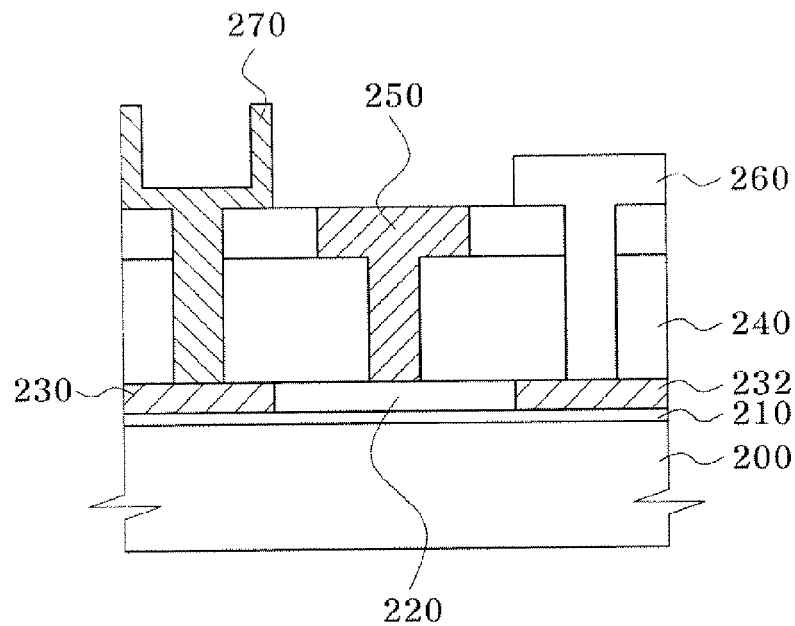
FIG. 3 is a cross-sectional view illustrating a memory device using a threshold voltage switching resistor as a switching device according to one embodiment of the present invention.

FIG. 3 is a cross-sectional view illustrating a memory device using the threshold voltage switching device according to one embodiment of the invention.

Referring to FIG. 3, a buffer layer 210 is arranged on a substrate 200 and a metal oxide film 210 is arranged on the buffer layer 210. In some cases, the buffer layer 220 may be omitted The metal oxide film 220 undergoes a rapid variation in resistance at a specific threshold voltage. The metal oxide film 220 is preferably made of a material selected from titanium oxide ($TiO_X$), zirconium oxide ($ZrO_X$), nickel oxide ($NiO_x$), niobium oxide ($Nb_2O_3$) and vanadium oxide ($V_2O_3$). The metal oxide film 220 used for threshold voltage switching is preferably formed as a metallic layer on the substrate 200 or the buffer layer 210 via chemical vapor deposition (CVD) or sputtering, and then oxidizing the metallic layer with materials such as oxygen gas or plasma. Alternatively, the metal oxide film 220 may be formed by atomic layer deposition (ALD). The oxidation of the metallic layer may be performed with oxygen ions. During the formation of the metallic layer, resistance may be controlled by injecting oxygen ions while adjusting the concentration thereof.

A first electrode 230 and a second electrode 232 are arranged at the opposite sides of the metal oxide film 220. A third electrode 250 is arranged on the metal oxide film 220. The first and second electrodes 230, 232 connect the threshold voltage switching element (i.e., the metal oxide film 220) to a capacitor and a bit line, respectively. More specifically, the first electrode 230 connects the threshold voltage switching element 220 to an upper electrode 270 of the capacitor. The second electrode 232 connects the threshold voltage switching element 220 to the bit line 260. The third electrode 250 connected to a word line applies a bias voltage to the threshold voltage switching element 220. The third electrode 250 is connected to the word line when a bias voltage is applied.

Figure 4:
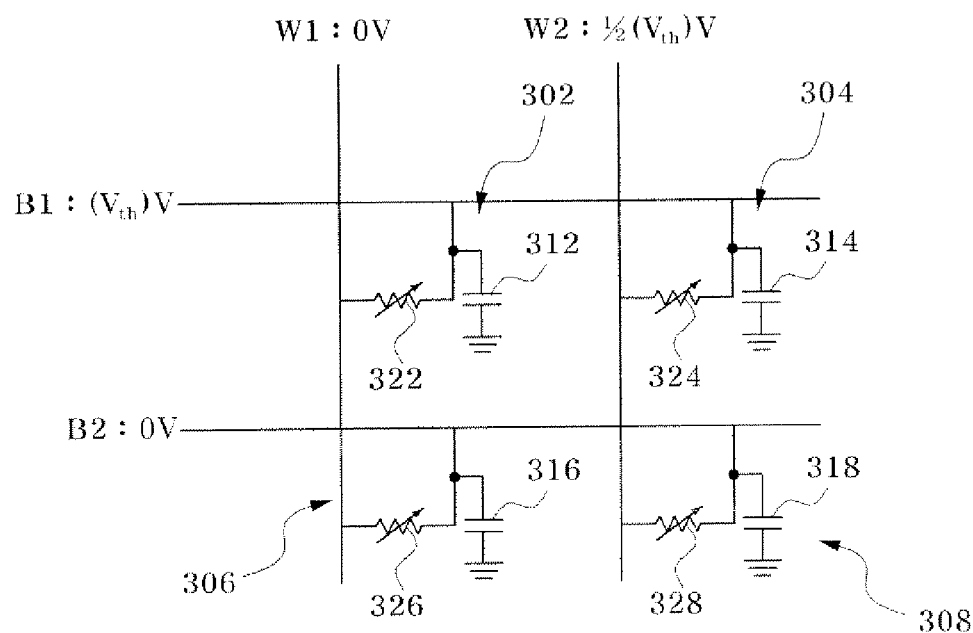
FIG. 4 is a circuit view illustrating a method for storing information in a memory device having a threshold voltage switching device according to the invention.

FIG. 4 is a circuit view illustrating a method for storing information in the threshold voltage switching element according to the invention.

Referring to FIG. 4, a plurality of word lines W1 and W2 are perpendicularly arranged to a plurality of bit lines B1 and B2. A plurality of capacitors 312, 314, 316, and 318 and a plurality of switching devices 322, 324, 326, and 328 are each formed at an intersection between an associated one of the word lines and an associated one of the bit lines. Unit memory cells 302, 304, 306 and 308 are formed at intersections between associated word lines and bit lines. One terminal of each threshold voltage switching device 322, 324, 326, and 328 is connected to the associated one of the word lines W1 or W2. The other terminal of each threshold voltage switching device 322, 324, 326, and 328 is connected to the corresponding capacitors 312, 314, 316, or 318, each of which is connected to the associated one of the bit lines B1 or B2. One threshold voltage switching device and one capacitor constitute a unit memory cell.

Hereinafter, a method for storing information in one unit memory cell 302 will be illustrated.

A bias voltage of 0 V is applied to one word line W1 connected to the unit memory cell 302 for information storage. A bias voltage corresponding to about half of the threshold voltage ($\frac{1}{2} V_{th}$) is applied to the other word line W2. A bias voltage higher than or equal to the threshold voltage is applied to one bit line B1 connected to the unit memory cell 302 for information storage. A bias voltage of 0V is applied to the other bit line B2. As a result, there is a difference in the electric potential equal to or higher than the threshold voltage between the bit line B1 and the word line W1 each connected to the terminals of the threshold voltage switching device 322 in the unit memory cell 302. Accordingly, since the threshold voltage switching device 322 in the unit memory cell 302 has a significantly low voltage, current flows through the unit memory cell 302. Electric charges are accumulate in the capacitor 312 connected to the threshold voltage switching device 322, thereby storing information in the unit memory cell 302.

On the other hand, the difference in electric potential between a first bit line B1 and a second word line W2 is half of the threshold voltage ($\frac{1}{2} V_{th}$), thus making it insufficient to activate the threshold voltage switching device 324. As a result, no information is stored in a the unit memory cell 304.

The difference in electric potential between a second bit line B2 and a first word line W1 is 0 V, a value that is also insufficient to activate the threshold voltage switching device 326. As a result, no information is stored in the unit memory cell 306.

The difference in electric potential between a second bit line B2 and a second word line W2 is half of the threshold voltage ($\frac{1}{2} V_{th}$), a value that is insufficient to activate the threshold voltage switching device 328. As a result, no information is stored in a the unit memory cell 308.

As mentioned above, when the desired difference in electric potential between the bit line and the word line is applied, information can be stored in a target cell.

As is apparent from the foregoing, according to the memory device and the method for storing information in the memory device, a threshold voltage switching device undergoing rapid variation in resistance at a specific voltage is used instead of a transistor, thereby increasing the level of integration and simplifying manufacture without any complicated layout or process. In addition, a voltage suitable to generate the desired difference in electric potential between the bit line and the word line is applied, thereby readily storing information in a target cell.

Embodiments of the invention have been disclosed above for illustrative purposes. Those skilled in the art will appreciate that various modifications, additions and substitutions are possible, without departing from the scope and spirit of the invention as defined in the accompanying claims.

What is claimed is:

1. A memory device having a threshold voltage switching device comprising:
    a plurality of word lines and a plurality of bit lines, each word line and bit line being regularly arranged; and
    a plurality of unit memory cells each formed at an intersection between an associated one of the word lines and an associated one of the bit lines,
    wherein each unit memory cell comprises:
    a capacitor connected to one of the bit lines; and
    a threshold voltage switching device comprising two terminals, one terminal being connected to the capacitor and the other terminal being connected to one of the bit lines, the threshold voltage switching device being capable of switching current flow at a specific threshold voltage via a rapid variation in resistance depending upon a voltage applied through the word line and the bit line;
    wherein the capacitor is capable of accumulating electric charges supplied from the bit line based on a switching operation of the threshold voltage switching device.

2. The memory device having a threshold voltage switching device according to claim 1, wherein the threshold voltage switching device comprises:
    a substrate;
    a material layer formed on the substrate, the material layer being capable of undergoing a rapid variation in resistance depending upon the voltage applied; and
    an electrode in contact with the material layer.

3. The memory device having a threshold voltage switching device according to claim 2, wherein the material layer comprises a metal oxide.

4. The memory device having a threshold voltage switching device according to claim 2, wherein the material layer is selected from the group consisting of titanium oxide ($TiO_x$), zirconium oxide ($ZrO_x$), nickel oxide ($NiO_x$), niobium oxide ($Nb_2O_3$) and vanadium oxide ($V_2O_3$).

5. The memory device having a threshold voltage switching device according to claim 2, wherein the electrode comprises:
    a first electrode in contact with the material layer at one terminal of the threshold voltage switching device, the first electrode electrically connecting the material layer to the capacitor;
    a second electrode in contact with the material layer at the other terminal of the threshold voltage switching device, the second electrode electrically connecting the material layer to one of the bit lines; and
    a third electrode arranged on the material layer, the third electrode being capable of applying a bias voltage to the material layer.

6. A method for storing information in a memory device having a threshold voltage switching device, the threshold voltage switching device being positioned at a memory cell defined at an intersection between a word line and an associated bit line among a plurality of other word lines and a plurality of other bits lines, the threshold voltage switching device being capable of switching current flow at a specific threshold voltage comprising:
    applying a voltage to the word line and the associated bit line such that the difference in electric potential between the word line and the associated bit line each connected to the memory cell is higher than the specific threshold voltage.

7. The method according to claim 6, comprising:
    applying a voltage of 0V to the word line connected to the memory cell;
    applying a voltage corresponding to the threshold voltage to the associated bit line connected to the memory cell;
    applying a voltage lower than the threshold voltage to the plurality of other word lines; and
    applying a voltage of 0V to the plurality of other bit lines.

* * * * *